(12) United States Patent
Okabe et al.

(10) Patent No.: US 10,882,228 B2
(45) Date of Patent: Jan. 5, 2021

(54) MOLD FOR INSERT MOLDING

(71) Applicant: DENSO CORPORATION, Kariya (JP)

(72) Inventors: Sayaka Okabe, Kariya (JP); Tohru Higuchi, Kariya (JP); Tsuyoshi Arai, Kariya (JP)

(73) Assignee: DENSO CORPORATION, Aichi-pref. (JP)

( * ) Notice: Subject to any disclaimer, the term of this patent is extended or adjusted under 35 U.S.C. 154(b) by 78 days.

(21) Appl. No.: 16/390,034

(22) Filed: Apr. 22, 2019

(65) Prior Publication Data

US 2019/0240883 A1 Aug. 8, 2019

Related U.S. Application Data

(63) Continuation of application No. PCT/JP2017/030233, filed on Aug. 24, 2017.

(30) Foreign Application Priority Data

Oct. 28, 2016 (JP) .................................. 2016-212117

(51) Int. Cl.
*B29C 45/14* (2006.01)
*B29C 33/12* (2006.01)
(Continued)

(52) U.S. Cl.
CPC ........ *B29C 45/14065* (2013.01); *B29C 33/12* (2013.01); *B29C 45/28* (2013.01);
(Continued)

(58) Field of Classification Search
CPC ............. B29C 33/12; B29C 45/14065; B29C 2045/14163; H01L 21/565; H01L 21/56
See application file for complete search history.

(56) References Cited

U.S. PATENT DOCUMENTS 4,456,576 A * 6/1984 Cotte ................ B29C 45/14065
264/255
4,900,441 A * 2/1990 Graus ................ B29C 45/14065
210/321.84

(Continued)

FOREIGN PATENT DOCUMENTS

JP 59063735 A * 4/1984 ............. B29C 33/14
JP 2014014954 A 1/2014
JP 2017049219 A 3/2017

OTHER PUBLICATIONS

Partial machine translation of JP59063735A dated Apr. 1984 obtained from the espace website. (Year: 1984).*

*Primary Examiner* — Robert B Davis
(74) *Attorney, Agent, or Firm* — Harness, Dickey & Pierce, P.L.C.

(57) ABSTRACT

A second mold is divided into a recess-side mold portion, which includes a recess, and a remaining mold portion in a sliding direction of a movable pin, while a size of a gap between the recess-side mold portion and the remaining mold portion is adjustable. The second mold is configured to execute a first-mold-closing operation for contacting the recess-side mold portion to the first mold and thereafter a second-mold-closing operation for contacting the remaining mold portion to the recess-side mold portion. A distal end portion of the movable pin is configured to be placed into a non-contacting state, in which the distal end portion of the movable pin is not in contact with the workpiece, at a time of executing the first-mold-closing operation. The distal end portion of the movable pin is configured to contact the portion of the workpiece at a time of executing the second-mold-closing operation.

2 Claims, 4 Drawing Sheets

(51) Int. Cl.
 *B29C 45/28* (2006.01)
 *H01L 21/56* (2006.01)
(52) U.S. Cl.
 CPC .............. *B29C 45/14655* (2013.01); *B29C 2045/14163* (2013.01); *B29C 2045/14852* (2013.01); *H01L 21/56* (2013.01)

(56) References Cited

U.S. PATENT DOCUMENTS

| | | | |
|---|---|---|---|
| 7,448,861 B2 * | 11/2008 | Koike | H01L 27/14806 |
| | | | 425/116 |
| 7,690,905 B2 * | 4/2010 | Tanida | H01L 21/566 |
| | | | 425/89 |
| 2014/0206122 A1 * | 7/2014 | Fernandez | H01L 21/565 |
| | | | 438/48 |
| 2017/0067768 A1 | 3/2017 | Yamaguchi et al. | |
| 2018/0274964 A1 | 9/2018 | Yamaguchi et al. | |

* cited by examiner ated Patent Application No. PCT/JP2017/030233 filed on Aug. 24, 2017, which designated the United States and claims the benefit of priority from Japanese Patent Application No. 2016-212117 filed on Oct. 28, 2016. The entire disclosures of all of the above applications are incorporated herein by reference.

TECHNICAL FIELD

The present disclosure relates to a mold for insert molding.

BACKGROUND

A mold (also referred to as a mold device) for insert molding is known. For instance, one such a mold includes a lower mold and an upper mold. A workpiece receiving recess, on which a workpiece is set, is formed at the lower mold. The upper mold includes: a cavity insert (or a movable pin), which projects from a lower end surface of the upper mold toward the workpiece; and a resilient member, which supports the cavity insert in a movable manner relative to the upper mold. The cavity insert is configured to contact a portion of the workpiece at a time of molding a resin material around the workpiece.

SUMMARY

According to the present disclosure, there is provided a mold for insert molding, including:

a first mold, at which a workpiece is to be installed;

a second mold that is placed to oppose the first mold, wherein the second mold is configured to form a cavity around the workpiece by a recess, which is formed at a side of the second mold where the first mold is placed, at a time of executing a mold closing operation for closing the first mold and the second mold relative to each other;

a movable pin that is slidably installed at the second mold, wherein the movable pin is configured to contact a portion of the workpiece at a distal end portion of the movable pin at the time of executing the mold closing operation; and a resilient member that is configured to adjust an amount of slide movement of the movable pin relative to the second mold such that the resilient member absorbs a variation in a thickness of the workpiece at a time of contacting the movable pin to the portion of the workpiece. The mold for insert molding is configured to mold a resin material around the workpiece by supplying the resin material into the cavity.

BRIEF DESCRIPTION OF DRAWINGS

The present disclosure, together with additional objectives, features and advantages thereof, will be best understood from the following description in view of the accompanying drawings.

DETAILED DESCRIPTION

Figure 1:
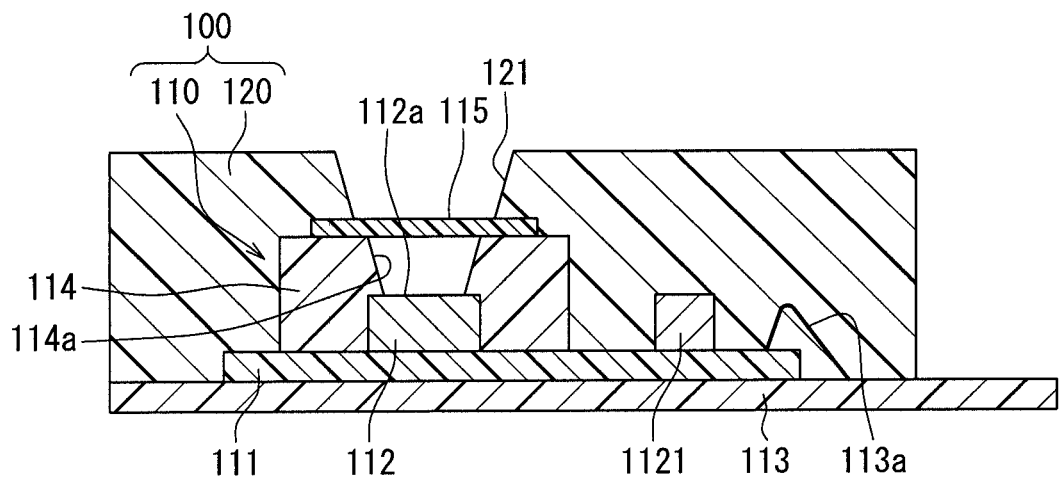
FIG. 1 is a cross-sectional view showing a representative example of a molded product that is molded by a mold for insert molding.

For example, a previously proposed mold for insert molding includes a lower mold and an upper mold. A workpiece receiving recess, on which a workpiece is set, is formed at the lower mold. The upper mold includes: cavity inserts, which project from a lower end surface of the upper mold toward the workpiece; and resilient members, which respectively support the cavity inserts in a movable manner relative to the upper mold.

First of all, the workpiece is set in the workpiece receiving recess of the lower mold. Thereafter, at the time of executing a mold closing operation for clamping the workpiece, the cavity inserts first contact a portion of the workpiece. Thereafter, when the mold closing operation is further advanced, the lower mold and the upper mold are progressively closed while the resilient members are compressed in the inside of the upper mold, and thereby the cavity inserts are held at the initial contact location, at which the cavity inserts initially contact the workpiece. Then, the resin is filled in a cavity, which is formed around the workpiece, so that the workpiece is resin molded and thereby becomes a finished product.

Even in a case where a variation exists in a thickness of the workpiece, the mold closing operation can be executed in such a manner that this variation is absorbed by the cavity insert and the resilient member. Thereby, reliable clamping of the workpiece is made possible. Thus, generation of unnecessary burrs and occurrence of damage to the workpiece can be limited.

However, the following disadvantage may exist in a case where the molten resin material intrudes into a slide gap between the cavity insert and the upper mold and causes sliding failure of the cavity insert (hereinafter referred to as a movable pin) due to, for example, fastening of the movable pin upon solidification of the intruded resin material. Specifically, when the sliding failure of the movable pin occurs, the absorption of the variation in the thickness of the resilient member cannot be made. Therefore, at the mold closing operation, the movable pin may further move toward the workpiece after contacting of the movable pin to the workpiece to possible cause damage of the workpiece.

According to an aspect of the present disclosure, there is provided a mold for insert molding, including:

a first mold, at which a workpiece is to be installed;

a second mold that is placed to oppose the first mold, wherein the second mold is configured to form a cavity around the workpiece by a recess, which is formed at a side of the second mold where the first mold is placed, at a time of executing a mold closing operation for closing the first mold and the second mold relative to each other;

a movable pin that is slidably installed at the second mold, wherein the movable pin is configured to contact a portion of the workpiece at a distal end portion of the movable pin at the time of executing the mold closing operation; and a resilient member that is configured to adjust an amount of slide movement of the movable pin relative to the second mold such that the resilient member absorbs a variation in a thickness of the workpiece at a time of contacting the movable pin to the portion of the workpiece, wherein:

the mold for insert molding is configured to mold a resin material around the workpiece by supplying the resin material into the cavity;

the second mold is divided into a recess-side mold portion, which includes the recess, and a remaining mold portion in a sliding direction of the movable pin, while the recess-side mold portion and the remaining mold portion are coupled with each other such that a size of a gap between the recess-side mold portion and the remaining mold portion is adjustable;

the second mold is configured to execute a first-mold-closing operation for contacting the recess-side mold portion to the first mold and thereafter a second-mold-closing operation for contacting the remaining mold portion to the recess-side mold portion at the time of executing the mold closing operation;

the distal end portion of the movable pin is configured to be placed into a non-contacting state, in which the distal end portion of the movable pin is not in contact with the workpiece, at a time of executing the first-mold-closing operation; and the distal end portion of the movable pin is configured to contact the portion of the workpiece at a time of executing the second-mold-closing operation.

According to the present disclosure, the movable pin is placed in the non-contacting state, in which the movable pin is not in contact with the workpiece, at the time of executing the first-mold-closing operation. If the movable pin is brought into the sliding failure due to, for example, the fastening of the movable pin to the recess-side mold portion, the movable pin is fastened to the recess-side mold portion in the non-contacting state, in which the movable pin is not in contact with the workpiece, at the first-mold-closing operation. Thereafter, at the time of executing the second-mold-closing operation, there is no change in the position of the movable pin relative to the recess-side mold portion. Thereby, the amount of slide movement of the movable pin, which is supposed to be generated by the second-mold-closing operation, is absorbed by the resilient member.

Therefore, even after the completion of the second-mold-closing operation, the movable pin is maintained in the non-contacting state, in which the movable pin is not in contact with the workpiece, (i.e., the movable pin is kept fastened). Therefore, even if the sliding failure of the movable pin occurs, the distal end portion of the movable pin does not cause damage to the workpiece.

Hereinafter, various embodiments of the present disclosure will be described. In each of the following embodiments, portions, which are described in a preceding embodiment(s), will be indicated by the same reference signs and may not be described further for the sake of simplicity. In each of the following embodiments, in a case where only a portion(s) of the structure is described, the rest of the structure may be the same as the one described in the preceding embodiment(s). Besides the explicitly described combination(s) of components in each of the following embodiments, the components of different embodiments may be partially combined even though such a combination(s) is not explicitly described as long as there is no problem.

First Embodiment

FIGS. 1 to 4 show a first embodiment of the present disclosure. A mold (also referred to as a mold device) 200 for insert molding according to the present embodiment is configured as a mold for molding, for example, a molded product 100 shown in FIG. 1. First of all, the molded product 100 (representative example) will be briefly described.

The molded product 100 is a sensor that is installed to, for example, a vehicle and measures a predetermined physical quantity. The molded product 100 is, for example, a humidity sensor that measures humidity of intake air (measurement-subject gas) that is supplied to the engine. Alternatively, the molded product 100 may be a sensor that measures, for example, pressure or temperature besides the humidity sensor. The molded product 100 is formed by molding a resin portion 120 around a predetermined region of a preformed product 110.

The preformed product 110 is an article that is in a stage before the time of molding the resin portion 120 around it and includes, for example, a substrate 111, a sensing element 112, a lead frame 113, a molded-resin portion 114 and a filter 115. The preformed product 110 corresponds to a workpiece of the present disclosure.

The substrate 111 is a plate member, on which a semiconductor element is installed.

The sensing element 112 is an element that is configured into a chip form and measures the humidity of the intake air. Specifically, the sensing element 112 has, for example, a capacitive element placed on the substrate 111 and adapts an electric-capacitance-based sensing method. An opposite surface of the sensing element 112, which is opposite from the substrate 111, is a sensing surface 112a. Another element (e.g., a capacitor) 1121 is also installed to the substrate 111 besides the sensing element 112.

The lead frame 113 is a printed circuit board (a wiring member) that has wirings for processing electric signals outputted from, for example, the sensing element 112 and the other element 1121. An opposite surface of the substrate 111, which is opposite from the sensing element 112, is joined to a surface of the lead frame 113. The sensing element 112 and the other element 1121 are electrically connected to the lead frame 113 by bonding wires 113a through the substrate 111.

The molded-resin portion 114 is a member that is made of resin and is configured to cover mainly a peripheral surface portion of the sensing element 112 on the substrate 111. The molded-resin portion 114 has a recess 114a that is recessed so that the molded-resin portion 114 does not cover the sensing surface 112a. The recess 114a is in a form of a bowl-shaped cavity that is tapered toward the sensing surface 112a. The sensing surface 112a is exposed to the outside through the recess 114a.

The filter 115 is a member that protects the sensing surface 112a of the sensing element 112, i.e., a member that limits adhesion of a foreign object or a water droplet contained in the intake air to the sensing surface 112a, and the filter 115 is configured to cover an opening of the recess 114a of the molded-resin portion 114. The filter 115 is, for example, a nonwoven fabric made of a material (e.g., polytetrafluoroethylene) that is excellent in the waterproofness and breathability.

The resin portion 120 is a member that is made of resin and is configured to surround the predetermined region (mainly the substrate 111, the other element 1121, the bonding wires 113a, and the molded-resin portion 114) around the preformed product 110 upon the molding. The resin portion 120 corresponds to a resin material of the present disclosure. For example, a thermosetting resin material, such as epoxy resin, is used to form the resin portion 120.

The resin portion 120 includes a resin recess 121 that is recessed and is placed at a region, which corresponds to the filter 115. The resin recess 121 is a portion that is formed when a distal end portion 226c of a movable pin 226 of the mold 200 for insert molding described later projects into a cavity 230. The resin recess 121 opens toward the outside of the resin portion 120. The resin recess 121 is in a form of a bowl-shaped cavity that is tapered toward the filter 115. An inner diameter of the resin recess 121 is set to be larger than an inner diameter of the recess 114a of the molded-resin portion 114. The resin recess 121 and the recess 114a are collectively shaped in a form of a bowl-shaped cavity. The intake air is introduced to the sensing surface 112a along the resin recess 121 and the recess 114a through the filter 115.

Figure 2:
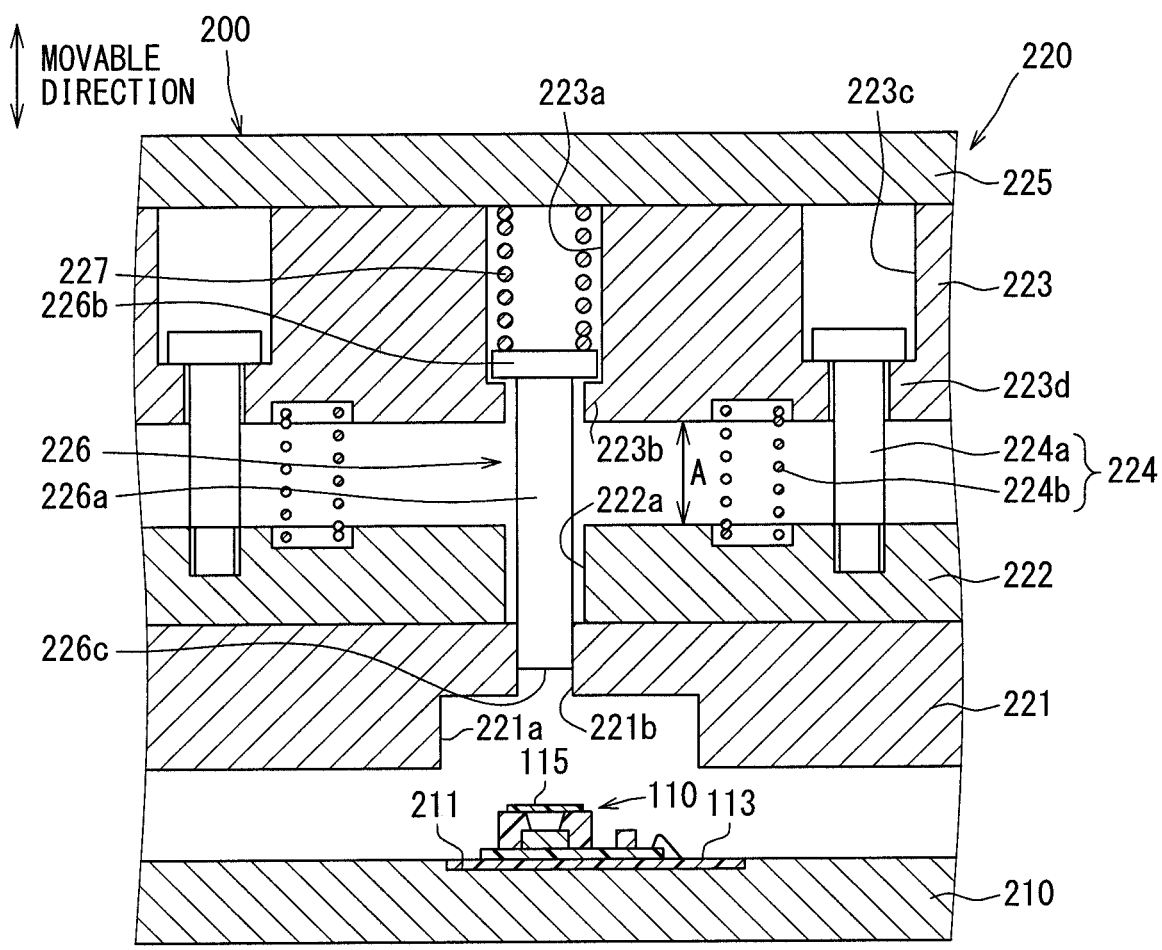
FIG. 2 is a cross-sectional view showing a structure of the mold for insert molding.

Next, the structure of the mold 200 for insert molding will be described with reference to FIG. 2. The mold 200 for insert molding includes a lower mold 210 and an upper mold 220. FIG. 2 indicates a state (mold-opened state) where the lower mold 210 and the upper mold 220 are opened relative to each other.

The lower mold 210 is a stationary mold that is joined to a stationary plate, and the preformed product 110 is placed on the lower mold 210. The lower mold 210 corresponds to a first mold of the present disclosure. The lower mold 210 includes a setting portion 211 that is in a form of a recess, which corresponds to the lead frame 113 of the preformed product 110. The preformed product 110 is placed on the setting portion 211.

The upper mold 220 is placed to oppose the lower mold 210 and is configured as a movable mold that is movable in a direction, along which the lower mold 210 and the upper mold 220 are arranged one after the other, to implement a mold-opened state and a mold-closed state. The direction, in which the upper mold 220 is movable relative to the lower mold 210, will be hereinafter referred to as a movable direction. The upper mold 220 includes a first block 221, a second block 222, a third block 223, a plurality of connecting portions 224, a movable plate 225, the movable pin 226 and a spring 227.

The first block 221 is a block that is in a plate form and is opposed to the lower mold 210. A recess 221a, which corresponds to the resin portion 120 of the molded product 100, is formed at a surface of the first block 221, which is opposed to the lower mold 210. When the first block 221 (the upper mold 220) is moved toward and is thereby closed relative to the lower mold 210, the cavity 230 (a space to be filled with the resin portion 120) is formed around the preformed product 110 by the recess 221a (see (a) and (b) of FIG. 3).

A through-hole 221b is formed at the recess 221a of the first block 221 to penetrate through the first block 221 in the movable direction at a location that corresponds to the filter 115 of the preformed product 110. The through-hole 221b is a hole, along which the distal end portion 226c of the movable pin 226 mainly slides. A gap, which is formed between the through-hole 221b and the distal end portion 226c in the radial direction, is very small and is highly accurately set within a range that enables slide movement of the distal end portion 226c to limit intrusion of the molten resin portion 120 into the gap.

The second block 222 is a block that is in a plate form and is placed on an opposite side of the first block 221, which is opposite from the lower mold 210. A through-hole 222a penetrates through the second block 222 in the movable direction at a location that corresponds to the through-hole 221b of the first block 221. The through-hole 222a is a hole, along which mainly a main body 226a (a portion located on a head 226b side of the distal end portion 226c) of the movable pin 226 slides. A size of the gap, which is defined between the through-hole 222a and the movable pin 226 in the radial direction, is set such that the movable pin 226 is appropriately guided in the through-hole 222a.

The second block 222 is mechanically joined to the first block 221 through, for example, bolts, so that the first block 221 and the second block 222 are integrally movable. A set of the first block 221 and the second block 222 corresponds to a recess-side mold portion of the present disclosure, which includes the recess 221a. The first and second blocks 221, 222 may be formed integrally in one piece.

The third block 223 is a block that is in a plate form and is placed on an opposite side of the second block 222 that is opposite from the first block 221. The third block 223 corresponds to a remaining mold portion of the present disclosure. The third block 223 has a receiving portion 223a (space), which receives the head 226b of the movable pin 226 and the spring 227 and is formed at a location that corresponds to the through-holes 221b, 222a. The receiving portion 223a is formed as a hole that penetrates through the third block 223 in the movable direction. A stopper 223b, which radially inwardly projects and limits a position of the head 226b of the movable pin 226, is formed at a periphery of an opening of the receiving portion 223a located on the second block 222 side.

Furthermore, a plurality of receiving portions 223c (spaces), each of which receives a head side of a connecting pin 224a of a corresponding one of the connecting portions 224, is formed at a region around the receiving portion 223a in the third block 223. Each receiving portion 223c is formed as a hole that penetrates through the third block 223 in the movable direction. A stopper 223d, which radially inwardly projects and limits a position of the head of the corresponding connecting pin 224a, is formed at a periphery of an opening of the corresponding receiving portion 223c located on the second block 222 side.

Each of the connecting portions 224 is a member that couples the third block 223 relative to the set of the first and second blocks 221, 222 in a manner that enables adjustment of a gap (size A) formed between the third block 223 and the set of the first and second blocks 221, 222, and each of the connecting portions 224 includes the connecting pin 224a and a spring 224b.

The connecting pin 224a is a rod member that has the head. A distal end portion of the connecting pin 224a, which is opposite from the head, is mechanically fixed to the second block 222. For example, a male thread is formed at the distal end portion of the connecting pin 224a, and a corresponding female thread is formed at the second block 222. The connecting pin 224a is fixed to the second block 222 by threadably engaging the male thread of the connecting pin 224a to the female thread of the second block 222. The head of the connecting pin 224a is received in the corresponding receiving portion 223c of the third block 223 such that the head side of the connecting pin 224a is slidable in the receiving portion 223c. Furthermore, a position of the head of the connecting pin 224a relative to the third block 223 is limited when the head of the connecting pin 224a contacts the stopper 223d.

Furthermore, the springs 224b serve as a plurality of resilient members that are interposed between the second block 222 and the third block 223 at a location adjacent to the connecting pins 224a. For example, a coil spring is used as each of the springs 224b. The springs 224b are configured to apply an urging force in a direction that increases the gap (size A) formed between the third block 223 and the set of the first and second blocks 221, 222.

The movable plate 225 is a plate member that is placed on an opposite side of the third block 223 opposite from the second block 222 and is moved by an external drive device in the movable direction. The third block 223 is mechanically joined to the movable plate 225 with, for example, bolts. That is, the third block 223 can be driven by the external drive device in the movable direction. The first and second blocks 221, 222 can be also driven in the movable direction along with the third block 223 through the connecting portions 224.

The movable pin 226 is a member configured for clamping the preformed product 110 at a time of executing a mold closing operation. The head 226b is formed at one end of the main body 226a, which is shaped into a rod form. The distal end portion 226c is formed at the opposite side of the movable pin 226, which is opposite from the head 226b.

The head 226b of the movable pin 226 is received in the receiving portion 223a of the third block 223 such that the head 226b of the movable pin 226 is slidable in the receiving portion 223a. The sliding direction of the movable pin 226 is the same as the movable direction of the upper mold 220. The position of the head 226b relative to the third block 223 is limited when the head 226b contacts the stopper 223b of the receiving portion 223a.

The distal end portion 226c of the movable pin 226 is inserted through the through-holes 221b, 222a. The position of the distal end portion 226c is preset such that in a state where the head 226b contacts the stopper 223b, and the heads of the connecting pins 224a contact the stoppers 223b (the state where the gap A is maximum), the distal end portion 226c does not project into the recess 221a (the cavity 230) of the first block 221. Specifically, the position of the distal end portion 226c is preset such that the distal end portion 226c is received within the through-hole 221b.

The spring 227 is a resilient member that is received in the receiving portion 223a of the third block 223. For example, a coil spring is used as the spring 227. One end of the spring 227 in an expanding and contracting direction of the spring 227 contacts the head 226b of the movable pin 226, and the other end of the spring 227 in the expanding and contracting direction of the spring 227 contacts the movable plate 225. The spring 227 exerts an urging force against the movable pin 226 to slide the movable pin 226 toward the lower mold 210 (toward the preformed product 110). Also, the spring 227 expands and contracts to enable adjustment of the amount of projection of the movable pin 226 in the recess 221a of the first block 221 according to a variation in the thickness of the preformed product 110.

Next, with reference to FIGS. 3 and 4, the operation of the mold 200 for insert molding constructed in the above described manner will be described. At the mold 200 for insert molding, the preformed product 110 is placed at the lower mold 210 in the mold-opened state. Then, a first-mold-closing operation and a second-mold-closing operation are executed. Thereafter, the resin portion 120 (the resin material in the molten state) is filled into the cavity 230.

1. Mold Opening Operation

Figure 3:
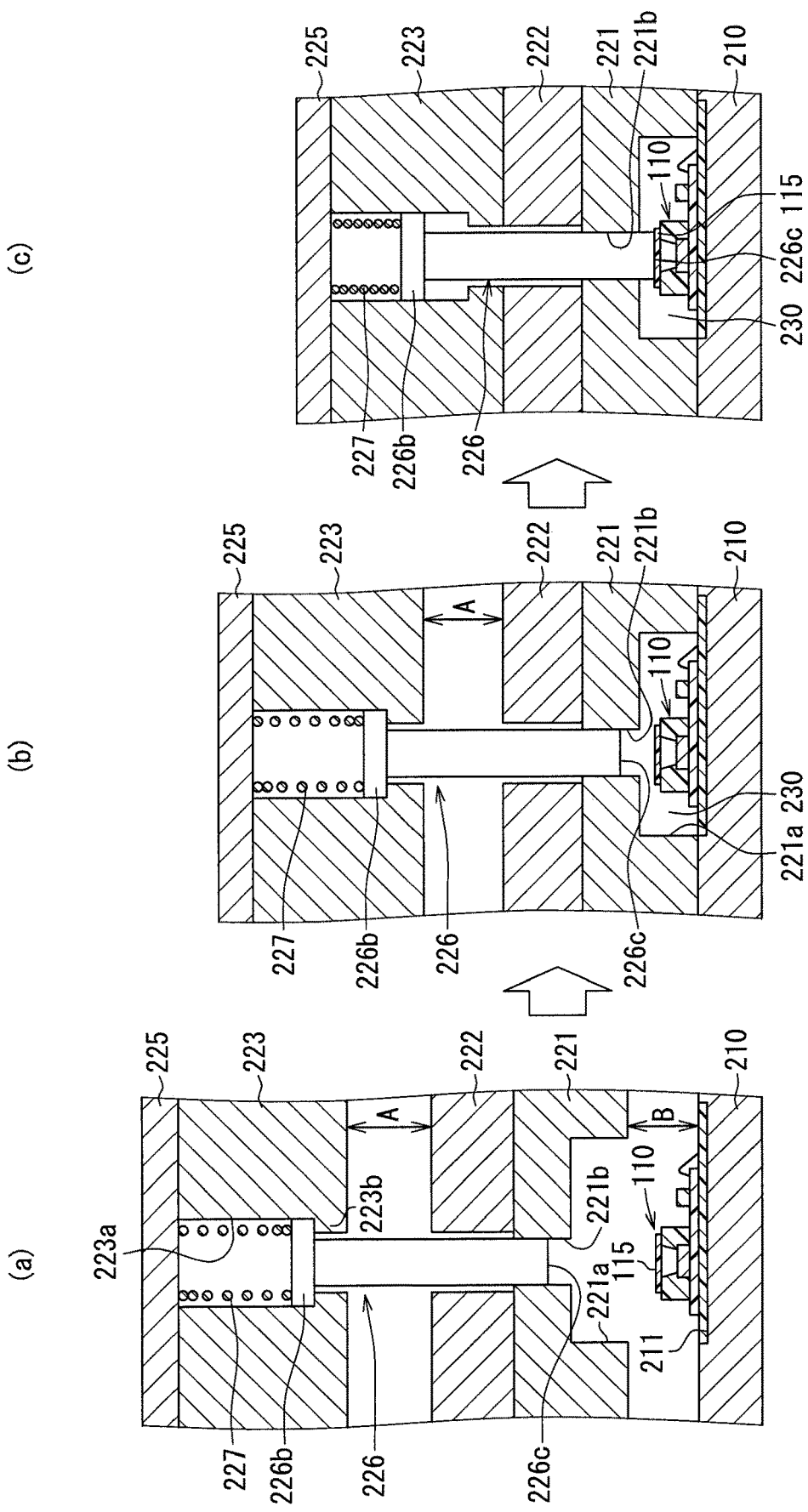
FIG. 3 is a cross-sectional view showing a normal operational state of the mold for insert molding.

The mold-opened state shown in (a) of FIG. 3 is implemented by the external drive device. At the mold opening time, the third block 223 is driven from the mold-closed state ((c) of FIG. 3) by the external drive device toward the opposite side, which is opposite from the lower mold 210, by a maximum amount (size A+size B described later).

At this time, the second block 222 is urged by the springs 224b of the connecting portions 224 in the direction away from the third block 223, and the head of each of the connecting pins 224a contacts the corresponding stopper 223d of the third block 223. Thereby, the gap (size A) between the second block 222 and the third block 223 is maximized. In the state where the maximum gap A is formed, the second block 222 and the first block 221 are driven together with the third block 223 through the connecting portions 224 toward the opposite side, which is opposite from the lower mold 210. Then, the mold-opened state, which implements the size B, is generated between the lower mold 210 and the first block 221.

At this time, the head 226b of the movable pin 226 is urged by the spring 227 toward the lower mold 210 and thereby contacts the stopper 223b of the third block 223, so that the position of the head 226b of the movable pin 226 is limited. Also, the distal end portion 226c of the movable pin 226 is received within the through-hole 221b without projecting into the recess 221a of the first block 221. Then, the preformed product 110 is set at the setting portion 211 of the lower mold.

2. First-Mold-Closing Operation

Next, the first-mold-closing operation for implementing the state shown at (b) of FIG. 3 is executed by the external drive device. The first-mold-closing operation is a mold closing operation that ends when the third block 223 is driven by the external drive device from the mold-opened state toward the lower mold 210 by the amount that corresponds to the size B. At this time, the first, second and third blocks 221, 222, 223 are integrally moved toward the lower mold 210 in the state where the size A of the gap is maintained between the second block 222 and the third block 223 by the springs 224b of the connecting portions 224. An end part of the first block 221, which is located on the lower mold 210 side, contacts the lower mold 210, so that the size B becomes zero, and the cavity 230 is formed around the preformed product 110 by the recess 221a.

Even at this time, similar to the mold-opened state discussed above, the head 226b of the movable pin 226 is urged by the spring 227 toward the lower mold 210, so that the head 226b contacts the stopper 223b of the third block 223, and thereby the position of the head 226b is limited. The distal end portion 226c of the movable pin 226 is received within the through-hole 221b without projecting into the recess 221a of the first block 221. Specifically, at this stage of the first-mold-closing operation, the distal end portion 226c is placed into a non-contacting state, in which the distal end portion 226c is not in contact with the preformed product 110.

3. Second-Mold-Closing Operation

Next, the second-mold-closing operation for implementing the state shown at (c) of FIG. 3 is executed by the external drive device. The second-mold-closing operation is a closing operation that is completed when the third block 223 is moved by the external drive device toward the lower mold 210 by the amount that corresponds to the size A from the end state of the first-mold-closing operation. At this time, the springs 224b of the connecting portions 224 are compressed by the force of the external drive device, and the head of each connecting pin 224a is slid in the corresponding receiving portion 223c of the third block 223 toward the movable plate 225. Thereby, the third block 223 contacts the second block 222, and thereby the gap A between the third block 223 and the second block 222 becomes zero.

At this stage of the second-mold-closing operation, the movable pin 226 is urged by the spring 227 toward the lower mold 210, and thereby the distal end portion 226c of the movable pin 226 projects into the cavity 230. The distal end portion 226c of the movable pin 226 abuts (contacts) the filter 115 (a portion of the filter 115) of the preformed product 110. Even in a case where the variation exists in the thickness of the preformed product 110, the variation is absorbed by the expansion and contraction of the spring 227, so that the contact position of the distal end portion 226c relative to the filter 115 is maintained.

4. Molding of Resin Portion 120

Next, a molten resin material is filled in the cavity 230 and is held at a predetermined temperature for a predetermined time period, and thereby the resin portion 120 is formed. Specifically, the preformed product 110 is integrated into the form of the molded product 100. Then, a mold opening operation is executed in an order of (c), (b) and (a) of FIG. 3, and then the molded product 100 is removed from the lower mold 210.

Figure 4:
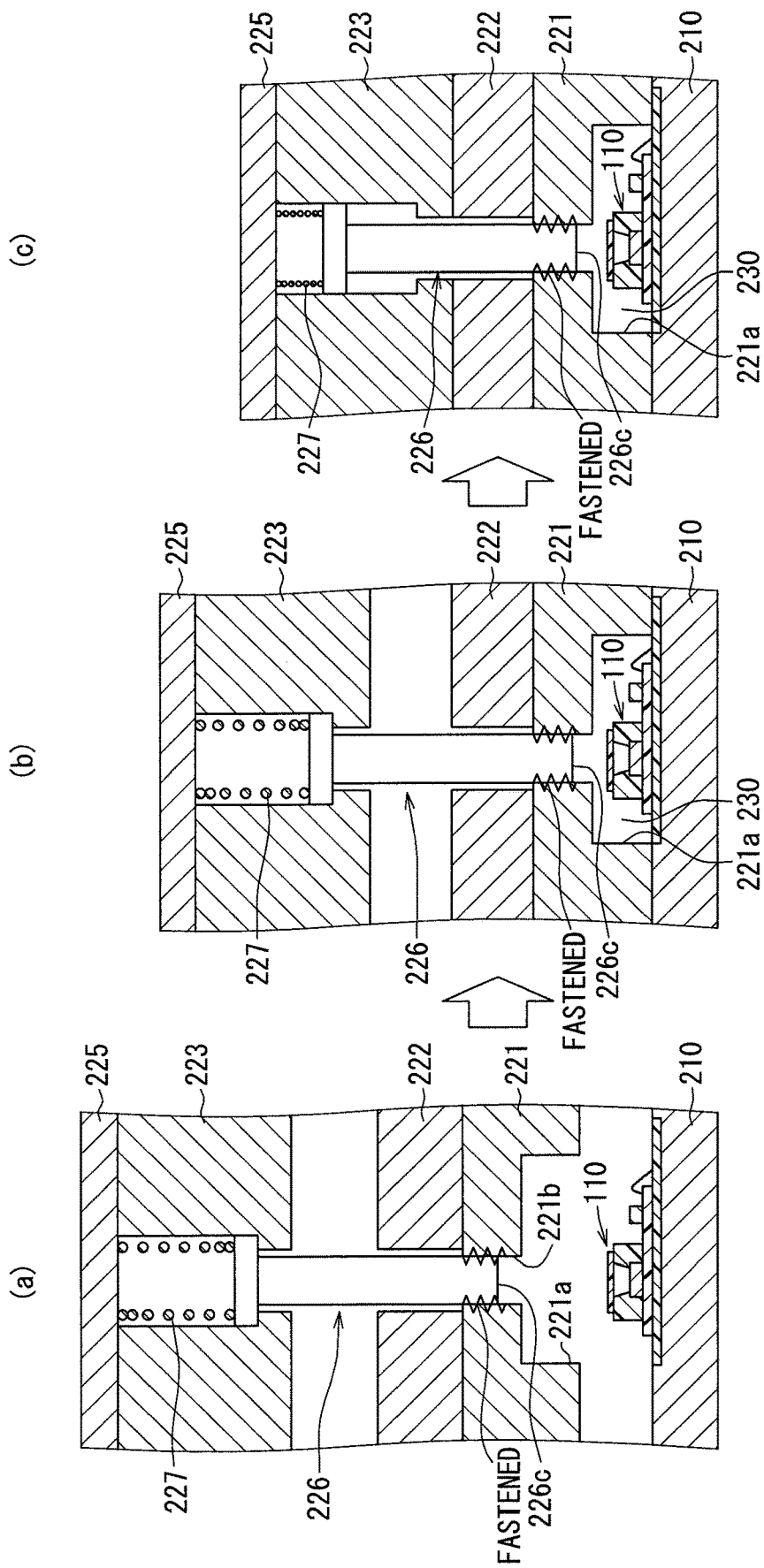
FIG. 4 is a cross-sectional view showing operational states in a case where fastening of a movable pin occurs.

Here, as shown at (a), (b) and (c) of FIG. 4, which correspond to (a), (b) and (c) of FIG. 3, when the molten resin material (resin portion 120), which intrudes into a gap between the through-hole 221b of the first block 221 and the distal end portion 226c of the movable pin 226, is solidified, the movable pin 226 is fastened to the first block 221, and thereby sliding failure of the movable pin 226 may occur.

In the present embodiment, the upper mold 220 is divided into the recess-side mold portion (the set of the first and second blocks 221, 222), which includes the recess 221a, and the remaining mold portion (the third block 223), and the recess-side mold portion and the remaining mold portion are coupled with each other by the connecting portions 224 in such a manner that the size of the gap A is adjustable. At the time of executing the mold closing operation, the first-mold-closing operation, in which the set of the first and second blocks 221, 222 is placed to contact the lower mold 210, is executed, and thereafter, the second-mold-closing operation, in which the third block 223 is placed to contact the set of the first and second blocks 221, 222, is executed.

Furthermore, the distal end portion 226c of the movable pin 226 is set to be placed in the non-contacting state, in which the distal end portion 226c is not in contact with the preformed product 110, at the first-mold-closing operation, and thereafter the distal end portion 226c contacts the portion of the preformed product 110 at the second-mold-closing operation.

If the movable pin 226 is brought into the sliding failure due to, for example, the fastening of the movable pin 226 to the first block 221, the movable pin 226 is fastened to the first block 221 in the non-contacting state, in which the movable pin 226 is not in contact with the preformed product 110, at the first-mold-closing operation. Thereafter, at the time of executing the second-mold-closing operation, there is no change in the position of the movable pin 226 relative to the first block 221. Thereby, the amount of slide movement of the movable pin 226, which is supposed to be generated by the second-mold-closing operation, is absorbed by the spring 227.

Therefore, even after the completion of the second-mold-closing operation, the movable pin 226 is maintained in the non-contacting state, in which the movable pin 226 is not in contact with the preformed product 110, (i.e., the movable pin 226 is kept fastened). Therefore, even if the sliding failure of the movable pin 226 occurs, the distal end portion 226c of the movable pin 226 does not cause damage to the preformed product 110.

Furthermore, at the time of normal operation, a region of the resin material 120, which corresponds to the distal end portion 226c of the movable pin 226, is formed as the resin recess 121. The distal end portion 226c of the movable pin 226 is set at the position where the distal end portion 226c is not yet projected into the cavity 230 at the time of the first-mold-closing operation.

In this way, even if the movable pin 226 is brought into the sliding failure due to the fastening, the resin recess 121 is not formed at the resin material 120 of the molded product 100, but on the contrary, a projection is formed at the resin material 120. Therefore, by visually checking whether the resin recessed portion 121 is present at the finished molded product 100, it is possible to easily make a pass/fail judgment of the product.

Furthermore, when the mold opening operation is executed after forming the resin portion 120 through the execution of the second-mold-closing operation during the normal operation time, the distal end portion 226c of the movable pin 226, which projects into the cavity 230, is retrieved into the through-hole 221b of the first block 221. Therefore, the resin material, which adheres to the distal end portion 226c, is scraped off at the opening of the through-hole 221b, so that anxiety related to the fastening can be alleviated. Here, it is desirable that the resin material, which is scraped off from the distal end portion 226c, is removed by, for example, suctioning of the resin material.

Figure 5:
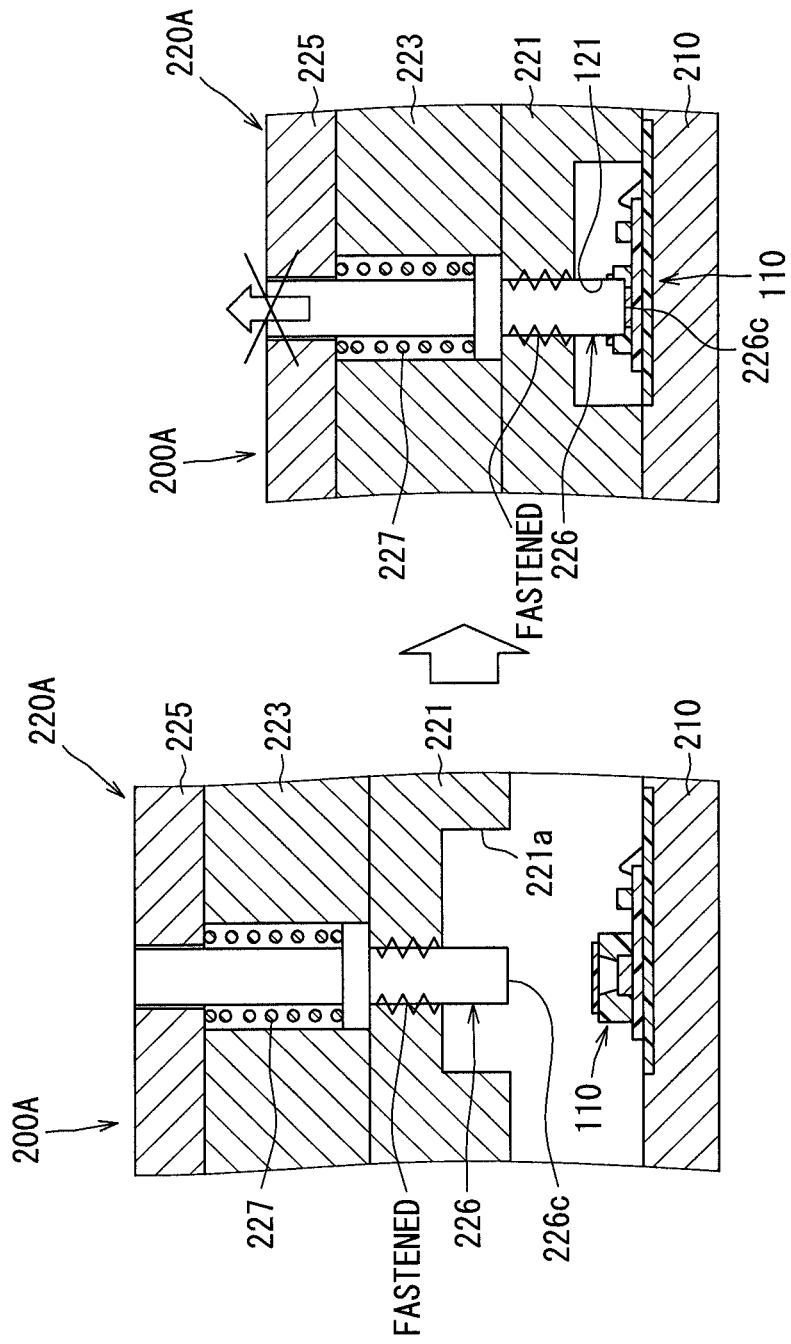
FIG. 5 is a cross-sectional view showing operational states in a case where fastening of the movable pin occurs at a mold for insert molding according to an aspect of a previously proposed technique.

FIG. 5 shows a mold 200A for insert molding constructed according to a previously proposed technique as a comparative example that is comparative to the present embodiment. An upper mold 220A is formed by integrally forming the first block 221 and the third block 223 together, so that the upper mold 220A does not have the function for executing the first-mold-closing operation and the second-mold-closing operation. The distal end portion 226c of the movable pin 226 always projects into the recess 221a.

According to the previously proposed technique discussed above, the sliding adjustment of the movable pin 226 by the spring 227 cannot be made upon occurrence of the fastening of the movable pin 226, so that the distal end portion 226c may possibly damage the preformed product 110. In this case, the distal end portion 226c forms the resin recess 121 at the molded product 100, so that it is difficult to distinguish a defective product based on the appearance of the finished molded product 100. According to the present embodiment, the above-described disadvantage of the previously proposed technique can be alleviated.

Other Embodiments

In the first embodiment, at the first-mold-closing operation, the distal end portion 226c of the movable pin 226 is received within the through-hole 221b of the first block 221 without projecting into the cavity 230. Alternatively, as long as the distal end portion 226c is held in the non-contacting state, in which the distal end portion 226c is not in contact with the preformed product 110, the distal end portion 226c may be configured to project toward the cavity 230 to such an extent that the distal end portion 226c is flush with the opening of the recess 221a or the distal end portion 226c does not contact the preformed product 110.

If the distal end portion 226c is placed at the location where the distal end portion 226c is flush with the opening of the recess 221a, the resin recess 121 is not formed at the finished molded product 100. Therefore, checking of presence of resin recess 121 may serve as an item of visual check of the finished product. If the distal end portion 226c is set to project into the cavity 230 to such an extent that the distal end portion 226c does not contact the preformed product 110, the resin recess 121, which has a smaller depth in comparison to the designed depth of the resin recess 121, is formed. Therefore, in such a case, the checking of presence of resin recess 121 may be slightly difficult to serve as the item of visual check of the finished product.

In the first embodiment, the lower mold 210 is formed as the stationary mold, and the upper mold 220 is formed as the movable mold. Alternatively, the lower mold 210 may be configured as a movable mold. In such a case, the first-mold-closing operation is executed by contacting the lower mold 210 to the first block 221, and the second-mold-closing operation is executed by contacting the set of the first and second blocks 221, 222 to the third block 223 along with the lower mold 210 in response to further movement of the lower mold 210.

The invention claimed is:

1. A mold for insert molding, comprising:
   a first mold, at which a workpiece is to be installed;
   a second mold that is placed to oppose the first mold, wherein the second mold is configured to form a cavity around the workpiece by a recess, which is formed at a side of the second mold where the first mold is placed, at a time of executing a mold closing operation for closing the first mold and the second mold relative to each other;
   a movable pin that is slidably installed at the second mold, wherein the movable pin is configured to contact a portion of the workpiece at a distal end portion of the movable pin at the time of executing the mold closing operation; and
   a resilient member that is configured to adjust an amount of slide movement of the movable pin relative to the second mold such that the resilient member absorbs a variation in a thickness of the workpiece at a time of contacting the movable pin to the portion of the workpiece, wherein:
   the mold for insert molding is configured to mold a resin material around the workpiece by supplying the resin material into the cavity;
   the second mold is divided into a recess-side mold portion, which includes the recess, and a remaining mold portion in a sliding direction of the movable pin, while the recess-side mold portion and the remaining mold portion are coupled with each other such that a size of a gap between the recess-side mold portion and the remaining mold portion is adjustable;
   the second mold is configured to execute a first-mold-closing operation for contacting the recess-side mold portion to the first mold and thereafter a second-mold-closing operation for contacting the remaining mold portion to the recess-side mold portion at the time of executing the mold closing operation;
   the distal end portion of the movable pin is configured to be placed into a non-contacting state, in which the distal end portion of the movable pin is not in contact with the workpiece, at a time of executing the first-mold-closing operation; and
   the distal end portion of the movable pin is configured to contact the portion of the workpiece at a time of executing the second-mold-closing operation.

2. The mold for insert molding according to claim 1, wherein a region of the resin material, which corresponds to the distal end portion of the movable pin, is formed as a resin recess; and
   a position of the distal end portion of the movable pin is set such that the distal end portion of the movable pin does not project into the cavity at the time of executing the first-mold-closing operation.

* * * * *